United States Patent
Morgan

(10) Patent No.: US 10,707,400 B1
(45) Date of Patent: Jul. 7, 2020

(54) SOLAR POWER CELL

(71) Applicant: Jack Morgan, Pryor, OK (US)

(72) Inventor: Jack Morgan, Pryor, OK (US)

( * ) Notice: Subject to any disclaimer, the term of this patent is extended or adjusted under 35 U.S.C. 154(b) by 0 days.

(21) Appl. No.: 15/795,777

(22) Filed: Oct. 27, 2017

Related U.S. Application Data

(60) Provisional application No. 62/413,472, filed on Oct. 27, 2016.

(51) Int. Cl.
*H01L 35/32* (2006.01)
*H01L 35/30* (2006.01)

(52) U.S. Cl.
CPC .............. *H01L 35/32* (2013.01); *H01L 35/30* (2013.01)

(58) Field of Classification Search
None
See application file for complete search history.

(56) References Cited

U.S. PATENT DOCUMENTS

| | | | |
|---|---|---|---|
| 4,210,121 A | 7/1980 | Stark | |
| 5,089,055 A | 2/1992 | Nakamura | |
| 7,929,065 B2 | 4/2011 | Chan | |
| 8,310,094 B2 * | 11/2012 | Yamada | H02J 7/35 307/46 |
| 8,707,947 B2 | 4/2014 | Hollis et al. | |
| 2008/0022683 A1* | 1/2008 | Ohler | F02C 6/14 60/641.8 |
| 2012/0227779 A1* | 9/2012 | Miao | H01L 35/30 136/206 |
| 2013/0098417 A1* | 4/2013 | Gavillet | H01L 23/4275 136/200 |
| 2013/0200714 A1* | 8/2013 | Pan | H02J 3/386 307/82 |
| 2016/0285390 A1* | 9/2016 | Rodriguez | H02J 7/34 |

FOREIGN PATENT DOCUMENTS

JP 03-263881 A * 11/1991 ............. H01L 35/32

OTHER PUBLICATIONS

JP03-263881A, Takeshi, Nov. 1991, Machine Translation.*

* cited by examiner

*Primary Examiner* — Devina Pillay
(74) *Attorney, Agent, or Firm* — Margaret Millikin

(57) ABSTRACT

The present invention is a plurality of solar power cells that each employs thermogenerators that are centered in a primary pool of silver metal surrounded by a secondary pool of silver metal in order to sense and absorb sunlight, directly and indirectly, and to absorb heat in order to produce electrical energy. The electrical current produced by the thermogenerators is then combined, balanced, converted to AC power, stepped up in voltage, and conditioned before being available for admission into the power grid.

9 Claims, 2 Drawing Sheets

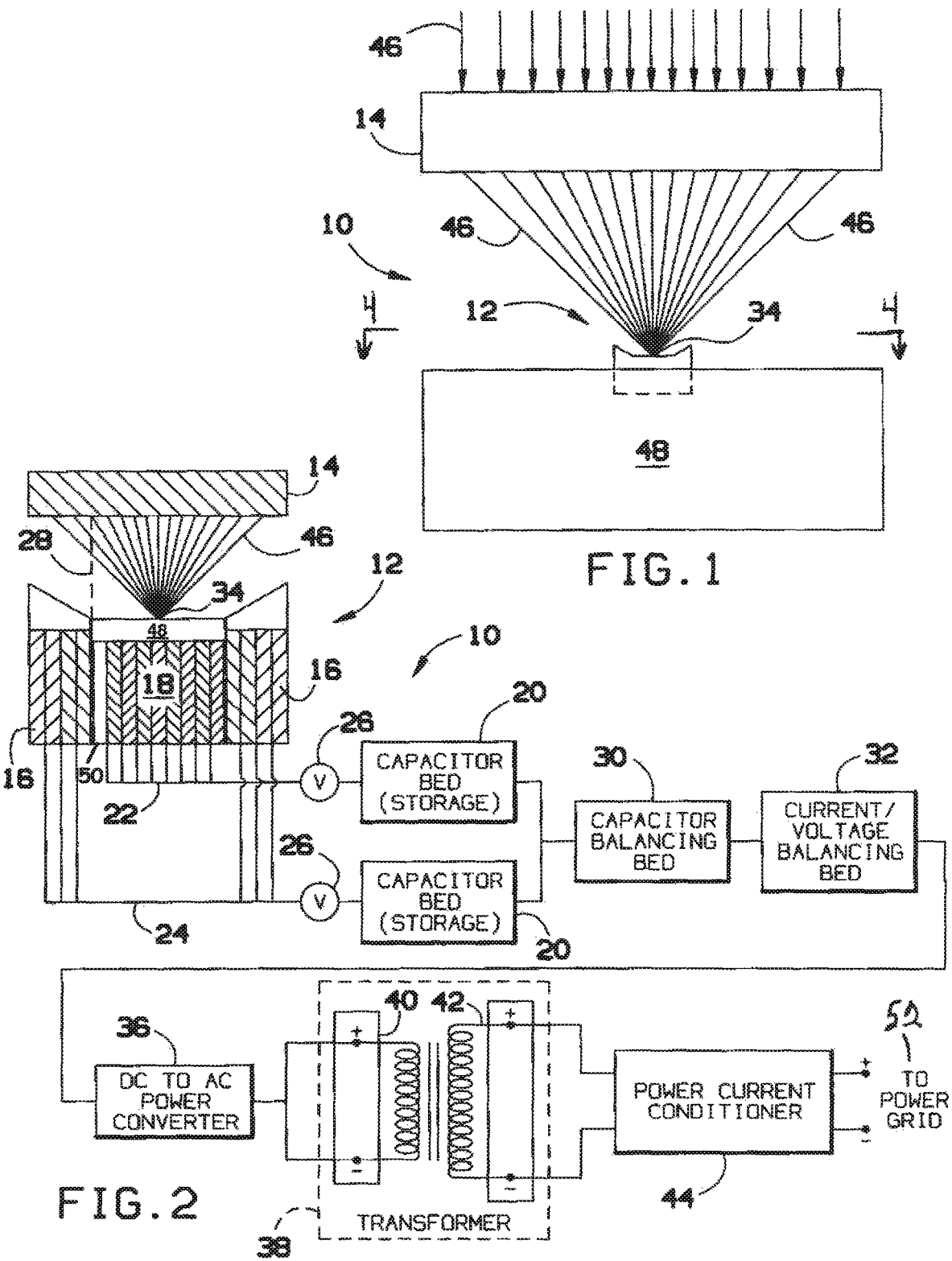

SOLAR POWER CELL

CROSS-REFERENCE TO RELATED APPLICATIONS

The present application claims priority to U.S. Provisional Patent Application No. 62/413,472 for Solar Power Cell that was filed on Oct. 27, 2016.

BACKGROUND OF THE INVENTION

1. Field of the Invention

The present invention is a solar power cell that employs a thermogenerator that is centered in a pair of pools of silver metal in order to sense and absorb sunlight, directly and indirectly, and to absorb heat in order to produce electrical energy.

2. Description of the Related Art

The invention is a solar power cell that relates to the Morgan Power Cell. The Morgan Power Cell uses a thermogenerator that is centered in a couple of silver pools of metal to sense and absorb sunlight, directly and indirectly, and to absorb heat to produce electrical energy. A thermogenerator, which is also called a thermal electric generator or a Seebeck generator, is a solid state device that converts heat flux directly into electrical energy through a phenomenon called the Seebeck effect. Thermoelectric generators function like heat engines, but are less bulky and have no moving parts.

This device is comprised of a magnifying lens assembly in combination with a power cell for generating electricity from sunlight. The lens assembly includes a magnifying lens that directs sunlight into light rays that impinge on the power cell at a focal point. The lens can be adjusted in its focal length to make that focal point impinge on a primary pool of silver metal provided centrally in the power cell. The primary silver pool is surrounded by a secondary pool of silver metal.

Encased within the power cell between the primary and secondary silver metal pools are thermogenerators that convert the heat from the two silver pools and use that heat to generate electricity. The primary and secondary silver pools generate electricity as separate electrical currents and those separate electrical currents feed through separate volt meters into separate capacity beds for storage. The capacitor beds feed the separate electrical currents to a capacitor balancing bed and then through a current/voltage balancing bed to produce a combined single electrical current.

From there, the combined electrical current is converted from DC to AC current in a DC to AC power converted and then is stepped up on voltage by a step up transformer. Finally, the electrical current passes through a power current conditioner before being available for introduction into the electrical power grid.

Although only one power cell has been illustrated and described, it is to be understood that the invention is not so limited. The invention uses multiple power cells that bundle together electrical power for introduction into the electrical power grid.

SUMMARY OF THE INVENTION

The present invention is a plurality of solar power cells that each employs thermogenerators that are centered in a primary pool of silver metal surrounded by a secondary pool of silver metal in order to sense and absorb sunlight, directly and indirectly, and to absorb heat in order to produce electrical energy. The electrical current produced by the thermogenerators is then combined, balanced, converted to AC power, stepped up in voltage, and conditioned before being available for admission into the power grid.

BRIEF DESCRIPTION OF THE DRAWINGS

FIG. 1 is a side view of a solar power cell that is constructed in accordance with a preferred embodiment of the present invention.

FIG. 2 is schematic of the various parts of the solar power cell of FIG. 1.

DETAILED DESCRIPTION OF THE PREFERRED EMBODIMENT

Figure 3:
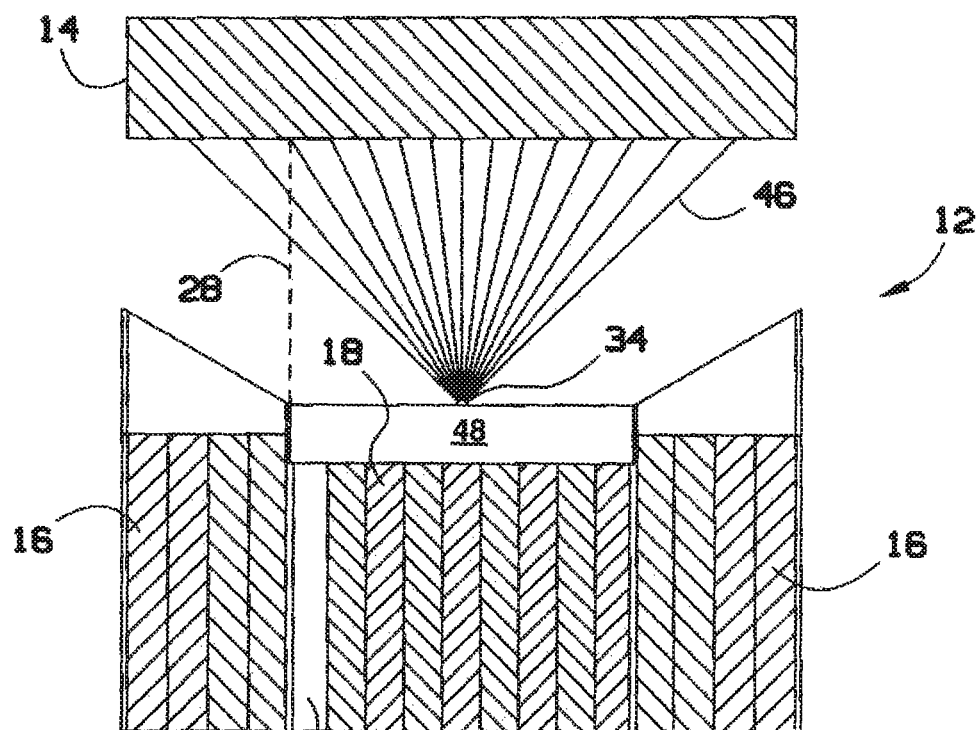
FIG. 3 is a partially enlarged cross sectional view of the magnifying lens assembly taken along line 3-3 of FIG. 4 with the primary and the secondary silver metal pools enlarged to show detail.
Figure 4:
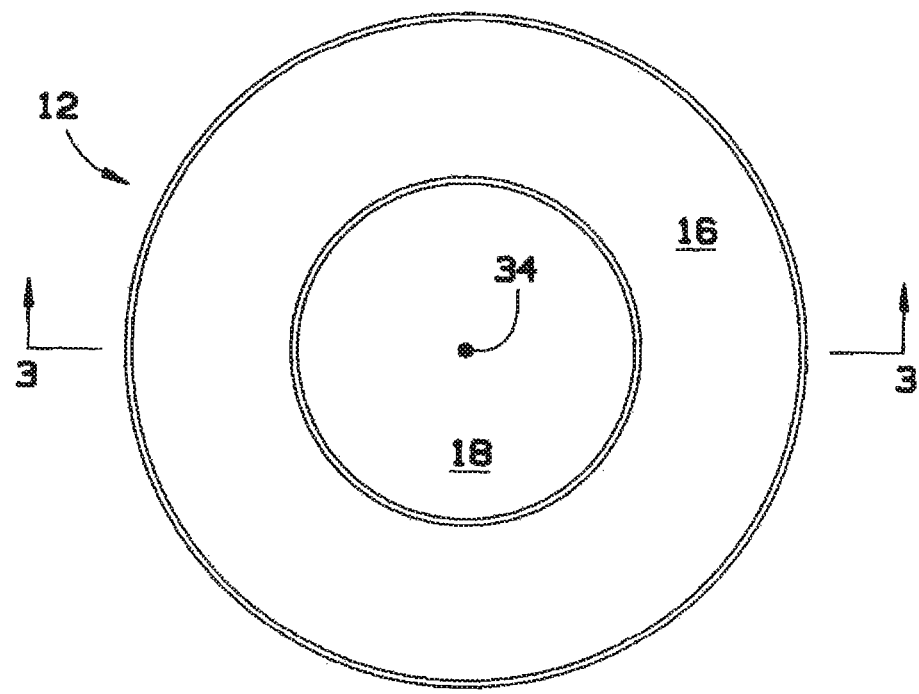
FIG. 4 is an enlarged top plan view of the primary and the secondary silver metal pools taken along line 4-4 of FIG. 1.

Referring now to the drawings and initially to FIG. 1, there is illustrated a solar power cell 10 that is constructed in accordance with a preferred embodiment of the present invention. As illustrated in FIGS. 2-4, the invention is a solar power cell 10 that uses thermogenerators 50 that are embedded in a primary silver pool of metal 18 surrounded by a secondary silver pool of metal 16 to sense and absorb sunlight, directly and indirectly, and to absorb heat to produce electrical energy.

As shown in FIG. 2, this device is employs a magnifying lens assembly 12 to direct solar light rays 46 onto the primary silver pool 18 provided in the power cell 10. The lens assembly 12 includes a magnifying lens 14 that directs the solar light rays 46 so that they impinge on the power conversion portion 48 of the cell 10 at a focal point 34. The lens 14 can be adjusted in its focal length 28 to make the focal point 28 impinge onto a surface of the primary pool of silver metal 18. The primary pool of silver metal 18 is provided centrally in the power cell 10, and as illustrated in FIGS. 3 and 4, the primary silver pool 18 is surrounded by the secondary pool of silver metal 16.

Referring now to FIGS. 2 and 3, encased within the power cell 10 between the primary and secondary silver metal pools 18 and 16 are thermogenerators 50 that convert the heat from the primary and secondary silver pools 18 and 16 into electrical power. The primary silver pool 18 generates electrical current 22 and the secondary silver pool 16 generates electrical current 24 and those separate electrical currents 22 and 24 feed through separate volt meters 26 into separate capacity beds 20 for storage. The capacitor beds 20 feed the separate electrical currents 22 and 24 to a capacitor balancing bed 30 and then through a current/voltage balancing bed 32 to produce a combined single electrical current.

From there, the combined electrical current is converted from DC to AC current in a DC to AC power converter 36 and then is stepped up in voltage by a step up transformer 38 where the low voltage electrical current enters on the low voltage or primary side or coil 40 of the step up transformer 38 and induces an electrical current in the high voltage or secondary side or coil 42 of the transformer 38 that is of a higher voltage. Finally, the electrical current passes through a power current conditioner 44 before being available for introduction into the electrical power grid 52.

Although only one solar power cell 10 has been illustrated and described, it is to be understood that the invention is not so limited. The invention uses multiple power cells 10 that bundle together electrical power for introduction into the electrical power grid 52.

While the invention has been described with a certain degree of particularity, it is manifest that many changes may be made in the details of construction and the arrangement of components without departing from the spirit and scope of this disclosure. It is understood that the invention is not limited to the embodiments set forth herein for the purposes of exemplification, but is to be limited only by the scope of the attached claim or claims, including the full range of equivalency to which each element thereof is entitled.

What is claimed is:

1. A solar power cell comprising:
    a magnifying lens assembly that focuses sunlight rays onto a primary pool of silver metal and heats the primary pool of silver metal, a secondary pool of silver metal surrounding the primary pool of silver metal, wherein heat from the primary pool of silver metal is transferred to and heats the secondary pool of metal, a plurality of thermogenerators located between the primary pool of silver metal and the secondary pool of silver metal, wherein the plurality of thermogenerators convert heat from the primary and the secondary pools of silver metal to a single electrical current.

2. A solar power cell according to claim 1 further comprising:
    a magnifying lens provided in the magnifying lens assembly, and said magnifying lens adjustable in its focal length to direct light rays to impinge at a focal point on the primary pool of silver metal.

3. A solar power cell according to claim 1, wherein the primary pool of silver metal is a solid, wherein sunlight rays through the magnifying lens assembly generate sufficient heat on the primary pool of silver to transform the primary pool of metal silver from a solid to a liquid, and wherein the primary pool of liquid silver re-solidifies when the heat on the primary pool of silver is reduced.

4. A solar power cell according to claim 1, wherein the secondary pool of silver is a solid, wherein heat from the primary pool of silver is sufficient to transform the secondary pool of metal silver from a solid to a liquid, and wherein the secondary pool of liquid silver re-solidifies when the heat from the primary pool of silver is reduced.

5. A solar power cell according to claim 1 further comprising:
    the plurality of thermogenerators comprise a primary thermogenerator and a secondary thermogenerator, the primary thermogenerator connected via a first voltmeter to a primary capacitor bed for receiving and storing a first portion of the single electrical current, the secondary thermogenerator connected via a second voltmeter to a secondary capacitor bed for receiving and storing a second portion of the single electrical current.

6. A solar power cell according to claim 5 further comprising:
    the primary capacitor bed and the secondary capacitor bed each connected to a capacitor balancing bed, the capacitor balancing bed is connected to a current and voltage balancing bed designed to produce the single electrical current from the first portion and the second portion of the single electrical current.

7. A solar power cell according to claim 6 further comprising:
    the current and voltage balancing bed connected to a DC to AC power converter which converts the single electrical current to an AC current.

8. A solar power cell according to claim 7 further comprising:
    the DC to AC power converter connected to a power transformer that steps up the voltage of the AC current.

9. A solar power cell according to claim 8 further comprising:
    the power transformer connected to a power current conditioner that conditions the stepped up voltage AC current making it available for introduction into an electrical power grid.

* * * * *